(12) United States Patent
Johnson et al.

(10) Patent No.: US 8,912,037 B2
(45) Date of Patent: Dec. 16, 2014

(54) METHOD FOR MAKING PHOTOVOLTAIC DEVICES USING OXYGENATED SEMICONDUCTOR THIN FILM LAYERS

(75) Inventors: James Neil Johnson, Scotia, NY (US); David Scott Albin, Denver, CO (US); Scott Feldman-Peabody, Golden, CO (US); Mark Jeffrey Pavol, Arvada, CO (US); Robert Dwayne Gossman, Aurora, CO (US)

(73) Assignees: First Solar, Inc., Tempe, AZ (US); Alliance for Sustainable Energy, LLC, Golden, CO (US)

( * ) Notice: Subject to any disclaimer, the term of this patent is extended or adjusted under 35 U.S.C. 154(b) by 383 days.

(21) Appl. No.: 13/192,545

(22) Filed: Jul. 28, 2011

(65) Prior Publication Data

US 2013/0029454 A1  Jan. 31, 2013

(51) Int. Cl.
*H01L 21/00* (2006.01)
*H01L 31/18* (2006.01)

(52) U.S. Cl.
CPC ............. *H01L 31/1836* (2013.01); *Y02E 10/50* (2013.01)
USPC ............... 438/95; 257/E31.018; 257/E31.026

(58) Field of Classification Search
CPC ........................... H01L 31/1836; Y02E 10/50
USPC ............... 438/95, 93; 257/E31.015, E31.018, 257/E31.026
See application file for complete search history.

(56) References Cited

U.S. PATENT DOCUMENTS

| | | | |
|---|---|---|---|
| 4,035,197 A | 7/1977 | Raychaudhuri | |
| 4,207,119 A | 6/1980 | Tyan | |
| 5,578,502 A | 11/1996 | Albright et al. | |
| 2010/0126580 A1 | 5/2010 | Farrell et al. | |
| 2010/0282320 A1 | 11/2010 | Meyers et al. | |

OTHER PUBLICATIONS

C.S. Ferekides, D. Marinskiy, V. Viswanathan, B. Tetali, V. Palekis, P. Selvaraj, D.L. Morel; High efficiency CSS CdTe solar cells; Thin Solid Films 361±362 (2000) 520±526; 7 Pages.

X. Wu, R.G. Dhere, Y. Yan, M.J. Romero, Y. Zhang, J. Zhou, C. Dehart, A. Duda, C. Perkins, and B. To; High-Efficiency Polycrystalline CdTe Thin-Film Solar Cells with an Oxygenated Amorphous CdS (a-CdS:O) Window Layer; May 2002; NREL/CP-520-31429; 7 Pages.

Y. Zhang, X. Wu, R. Dhere, J. Zhou, Y. Yan, and A. Mascarenhas; Raman Studies of Nanocrystalline CdS:O Film; Program Review Meeting Oct. 25-28, 2004 Denver, Colorado; 5 Pages.

V. Valdna; Optoelectronic properties of chlorine- and oxygen-doped CdTe thin films; Solar Energy Materials & Solar Cells 87 (2005) 369-373.

*Primary Examiner* — Stephen W Smoot
*Assistant Examiner* — Vicki B Booker
(74) *Attorney, Agent, or Firm* — MacMillan, Sobanski & Todd, LLC

(57) ABSTRACT

A method for making a photovoltaic device is presented. The method includes steps of disposing a window layer on a substrate and disposing an absorber layer on the window layer. Disposing the window layer, the absorber layer, or both layers includes introducing a source material into a deposition zone, wherein the source material comprises oxygen and a constituent of the window layer, of the absorber layer or of both layers. The method further includes step of depositing a film that comprises the constituent and oxygen.

21 Claims, No Drawings

METHOD FOR MAKING PHOTOVOLTAIC DEVICES USING OXYGENATED SEMICONDUCTOR THIN FILM LAYERS

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

The invention relates generally to photovoltaic devices. In particular, the invention relates to a method for making photovoltaic devices that includes a semiconductor layer, for example, a window layer or an absorber layer.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. Cadmium telluride/cadmium sulfide (CdTe/CdS) heterojunction-based photovoltaic cells are one such example of thin film solar cells.

CdTe/CdS-based photovoltaic devices typically demonstrate relatively low power conversion efficiencies, which may be attributed to a relatively low open circuit voltage ($V_{oc}$) in relation to the band gap of the semiconductor materials, which is due, in part, to the low effective carrier concentration and short minority carrier lifetime in CdTe. However, oxygenated CdS and CdTe layers show improved cell performance.

Typical methods used to deposit these oxygen-containing semiconductor layers (CdS and CdTe layers) use oxygen gas during the deposition process. That is, the deposition of the layers is carried out in presence of oxygen. However, these methods are relatively complicated and require a number of hardware components to allow oxygen processing during manufacturing.

Accordingly, there remains a need for more efficient and less complicated methods of fabricating semiconductor layers for a photovoltaic device.

BRIEF DESCRIPTION OF THE INVENTION

One embodiment is a method for making a photovoltaic device. The method includes steps of disposing a window layer on a substrate and disposing an absorber layer on the window layer. Disposing a window layer, an absorber layer, or both layers includes introducing a source material into a deposition zone, wherein the source material comprises oxygen and a constituent of the window layer, of the absorber layer or of both layers. The method further includes step of depositing a film that comprises the constituent and oxygen.

In one embodiment, disposing a window layer, disposing an absorber layer, or disposing the window layer and the absorber layer includes oxidizing a source material precursor to form a source material, introducing the source material into a deposition zone, and depositing a film. The film comprises a constituent of the source material and oxygen.

According to one embodiment of the invention, the method includes the steps of disposing a window layer on a substrate and disposing an absorber layer on the window layer. Disposing an absorber layer includes oxidizing a source material precursor that includes cadmium and tellurium to form a source material including cadmium, tellurium and oxygen. The method further includes introducing the source material into a deposition zone and depositing a film that includes cadmium telluride and oxygen.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a," "an" and "the" include plural referents unless the context clearly dictates otherwise. The use of "or" is not exclusive and refers to at least one of the reference items or elements unless the context clearly dictates otherwise. The terms "comprising," "including," and "having" are intended to be inclusive and mean that there may be additional elements other than the listed elements. Moreover, the use of "top," "bottom," "above," "below," and variations of these terms is made for convenience, but does not require any particular orientation of the components unless otherwise stated.

The term "transparent material" and "transparent layer," as used herein, means that a material or a layer allows the passage of a substantial portion of incident electromagnetic radiation having a wavelength in a range from about 300 nm to about 850 nm. The substantial portion may be at least about 80% of the incident radiation.

As used herein, the term "disposed on" or "disposed over" refers to both secured or disposed directly in contact with or indirectly by having intervening layers therebetween, unless otherwise specifically indicated.

Embodiments of the invention described herein provide a method for making a photovoltaic device. The method includes steps of disposing a window layer over a substrate followed by disposing an absorber layer over the window layer. As used herein, the term "substrate" refers to a support structure on which layers are deposited. In certain instances, the substrate may include a transparent material. Suitable examples of substrate material may include, but are not limited to, glass, semiconductor, doped semiconductor, amorphous dielectrics, crystalline dielectrics, polymer and combinations thereof. In certain embodiments, the substrate is a glass plate. In certain other embodiments, the substrate is a flexible polyimide.

The term "window layer" as used herein refers to a semiconducting layer that is substantially transparent and forms a heterojunction with the absorber layer. Non-limiting exemplary semiconductor materials for the window layer include cadmium sulfide (CdS), indium III sulfide ($In_2S_3$), zinc sulfide (ZnS), zinc telluride (ZnTe), zinc selenide (ZnSe), cadmium selenide (CdSe), cadmium sulfide (CdS), copper oxide ($Cu_2O$), zinc oxihydrate (ZnO,H), or combinations thereof. In a particular embodiment, the window layer includes CdS. In some embodiments, the window layer includes an n-type semiconductor material. In such embodiments, the absorber layer may be doped to be p-type and the window layer and the absorber layer may form an "n-p" heterojunction.

In some embodiments, disposing the window layer includes disposing the window layer on a transparent conductive layer disposed on the substrate. The transparent layer includes an electrically conductive layer (sometimes referred to as a front contact layer in the art). In some embodiments, the transparent conductive layer may be disposed on the substrate by any suitable technique, such as sputtering, chemical vapor deposition, spin coating, spray coating, or dip coating.

Suitable materials for the transparent conductive layer may include an oxide. The layer may also be referred to as transparent conductive oxide (TCO) layer. These transparent conductive oxides may be doped or undoped. In certain embodiments, the transparent conductive layer may include titanium dioxide, silicon oxide, zinc oxide, tin oxide, aluminum doped zinc oxide, fluorine-doped tin oxide, cadmium tin oxide (CTO), or zinc tin oxide. Some examples of suitable indium containing oxides are indium tin oxide (ITO), GaInSnO, ZnInSnO, GaInO, ZnInO, and combinations thereof. Depending on the specific material employed and on its sheet resistance, the thickness of the TCO layer may be in a range of from about 50 nm to about 600 nm, in one embodiment.

In some embodiments, the window layer may be disposed directly on the transparent conductive layer. Non-limiting examples of the deposition methods for the window layer include a close-space sublimation (CSS) method, a vapor transport method (VTM), sputtering, or electrochemical bath deposition (CBD).

In some embodiments, an optional secondary transparent conductive layer with higher sheet resistance than that of the transparent conductive layer may be disposed on the transparent conductive layer before disposing the window layer. This secondary transparent conductive layer is known as high-resistance transparent (HRT) layer or high-resistance transparent conductive layer. In one embodiment, the thickness of the HRT layer is in a range from about 50 nm to about 200 nm. Undoped zinc stannate ($ZnSnO_4$), zinc oxide (ZnO), and tin oxide ($SnO_2$) may be employed as the HRT layer. The HRT layer usually permits the use of a thinner CdS window layer in a photovoltaic cell than is feasible without the HRT layer, thereby increasing the quantum efficiency of the cell in the blue region. The HRT layer may also improve the cell efficiency by forming a barrier against diffusion of unwanted species from the substrate and a front contact to the CdS window layer.

The term "absorber layer" as used herein refers to a semiconducting layer wherein the solar radiation is absorbed. Typically, when solar radiation is incident on the photovoltaic device, electrons in the absorber layer are excited from a lower energy "ground state," in which they are bound to specific atoms in the solid, to a higher "excited state," in which they can move through the solid.

In one embodiment, a photoactive material is used for forming the absorber layer. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium sulphide (CIS), copper indium gallium deselenide (CIGS), copper zinc tin sulphide (CZTS), or combinations thereof. The above-mentioned photo-active semiconductor materials may be used alone or in combination. Further, these materials may be present in more than one layer, each layer having different type of photo-active material or having combinations of the materials in separate layers. In one particular embodiment, the absorber layer includes cadmium telluride (CdTe). In one particular embodiment, the absorber layer includes p-type cadmium telluride (CdTe).

As discussed above, the method includes step of disposing the absorber layer over the window layer. In one embodiment, the absorber layer may be deposited by employing one or more methods selected from close-space sublimation (CSS), vapor transport method (VTM), ion-assisted physical vapor deposition (IAPVD), radio frequency or pulsed magnetron sputtering (RFS or PMS), plasma enhanced chemical vapor deposition (PECVD), and electrochemical deposition (ECD).

In some embodiments, the window layer and the absorber layer may be doped with a p-type dopant or an n-type dopant to form a heterojunction. As used in this context, a heterojunction is a semiconductor junction that is composed of layers of dissimilar semiconductor material. These materials usually have non-equal band gaps. As an example, a heterojunction can be formed by a contact between a layer or region of one conductivity type with a layer or region of opposite conductivity type, e.g., a "p-n" junction.

In one embodiment, the absorber layer includes a p-type semiconductor material. In one embodiment, the absorber layer has an effective carrier density in a range from about $1 \times 10^{13}$ per cubic centimeter to about $1 \times 10^{16}$ per cubic centimeter. As used herein, the term "effective carrier density" refers to the average concentration of free holes or electrons in a material. In such instances, the window layer may be doped to be n-type, and the absorber layer and the window layer may form a "p-n" or "n-p" junction, as mentioned above.

Furthermore, the window layer, the absorber layer or both layers may contain oxygen. Oxygen-containing layer may also be referred to as an oxygenated window layer or an oxygenated absorber layer. Without being bound by any theory, it is believed that oxygen introduction to the window layer and/or the absorber layer provides high efficiency and improved device performance. Typical methods used to deposit these oxygenated window and/or absorber layers employ deposition of source materials (for example CdTe and CdS) in the presence of oxygen as a process gas (that is, in an oxygen-containing environment) throughout the growth process. However, such methods may require developing and maintaining oxygen-capable manufacturing components (for example, components that employ anti-corrosive coatings, oxygen-resistant coatings) for using oxygen gas during deposition. In addition, these deposition methods may adversely affect the material utilization and throughput as deposition rates are significantly lower in the presence of oxygen.

Embodiments of the invention described herein address the noted shortcomings of the state of the art. The method for making the photovoltaic device includes the steps of disposing the window layer, the absorber layer or both the window layer and the absorber layer, according to one embodiment of the invention. The method includes step for introducing a source material into a deposition zone, followed by step for depositing a film that comprises a constituent of the window layer, of the absorber layer, or of both layers and oxygen. As used herein, the term "source material" refers to a material to be deposited to form a film or layer, and may also be referred to as a target material. Typically, particles or atoms are derived from the target material, and are deposited on a substrate or support to form a film. The target material may comprise an element, a mixture of elements, an alloy, or a compound.

According to one embodiment of the invention, the source material comprises oxygen and a constituent of the window layer, of the absorber layer, or of both layers. As used herein, the term "constituent" refers to an element of a semiconductor material used for the window layer or the absorber layer as described in detail previously. In certain embodiments, the source material may include an oxide of the constituent. For example, cadmium oxide may be introduced within the deposition zone as a source material.

In some instances, an additional source material also may be placed within the deposition zone. The additional source material may include an additional constituent of the window layer, of the absorber layer, or of both layers. The additional constituent may be employed in an elemental form or a compound form (i.e., an oxide). For example, zinc may be placed in elemental form or as zinc oxide within the deposition zone. In an illustrative embodiment, cadmium oxide and tellurium may be placed in the deposition zone for the deposition of an oxygenated cadmium telluride (CdTe:O) layer.

Moreover, in some instances, the film formed after deposition may be processed or treated, for example to provide desired composition or structure. For example, cadmium oxide is employed as a source material to form a film that contains cadmium and oxygen. The film may be then subjected to sulfurization to form an oxygenated cadmium sulfide (CdS:O) layer. As used herein, "sulfurization" refers to exposing the cadmium-containing layer in a sulfur-containing atmosphere to substantially transform the cadmium to cadmium sulfide. In one embodiment, the sulfur-containing atmosphere includes a sulfur-containing gas. Suitable examples of sulfur-containing gas include, but are not limited to, hydrogen sulfide, carbon disulfide, sulfur hexafluoride ($SF_6$), sulfur dichloride, alkane thiols, and thioethers.

Conventionally, semiconductor materials are used as source material for the deposition of the window layer, the absorber layer, or both layers. Instead, an oxidation product of the semiconductor material may be employed, according to some embodiments of the invention. Thus, in some embodiments, the method further includes a step of oxidizing a source material precursor to form the source material. The source material precursor may include the semiconductor material suitable for the window layer, such as CdS or the absorber layer, such as CdTe, as discussed previously. In these embodiments, the source material includes the oxidation product. In some embodiments, the source material may include oxygen and multiple constituents of the window layer, of the absorber layer, or of both layers. In some embodiments, the source material may include a binary phase, a ternary phase, or both phases.

The oxidation step may be performed by exposing the source material precursor to an oxygen environment. The oxidation of the source material precursor depends in part on the oxygen pressure, the oxidation time, and the temperature selected. In some embodiments, the oxidation is carried out at an oxygen pressure ranging from about 100 mTorr to about 10 Torr and at a temperature ranging from about 550 degrees Celsius to about 750 degrees Celsius. In certain embodiments, the oxygen pressure may range from about 400 mTorr to about 1 Torr. In some embodiments, oxidation is carried out for a period ranging from about 2 minutes to about 5 hours, and in certain embodiments, from about 5 minutes to about 30 minutes.

In one embodiment, the oxidation step may be carried out inside the deposition zone, for example in a deposition chamber. In another embodiment, the oxidation may be accomplished outside the deposition chamber to avoid the existence of an oxygen-containing environment in the deposition chamber. The oxidized source material precursor, i.e., the source material, may be placed or supplied to the deposition chamber to carry out the deposition step. In some instances, the source material may be continuously fed or supplied into the deposition chamber during the deposition process.

Some embodiments provide deposition of the film to a thickness ranging from about 50 nm to about 4 microns. The thickness of a window layer is typically desired to be minimized in a photovoltaic device to achieve high efficiency. In some embodiments, the thickness of the window layer is between about 50 nanometers and about 100 nanometers. In some embodiments, the thickness of the absorber layer ranges from about 200 nanometers to about 3 microns.

A certain amount of oxygen may be present in the film that is deposited using the source material. In some embodiments, the oxygen content is greater than about $4\times10^{17}$ cm$^{-3}$ and less than about $2\times10^{19}$ cm$^{-3}$. In certain embodiments, the oxygen content may vary between about $1\times10^{18}$ cm$^{-3}$ and about $2\times10^{19}$ cm$^{-3}$, and in specific embodiments, between about $4\times10^{18}$ cm$^{-3}$ and about $2\times10^{19}$ cm$^{-3}$. Moreover, the oxygen content may be distributed uniformly or non-uniformly throughout the thickness of the film. In some instances, the film may be deposited having a graded oxygen concentration. One way to achieve a graded profile is to use multiple source material configurations with varying oxygen concentrations and activating different source materials at different points of the deposition process.

The above-discussed method advantageously provides a relatively simple and economic process to deposit an oxygenated semiconductor layer as compared to currently available methods. Deposition of a layer in oxygen environment is difficult and requires oxygen-capable manufacturing equipment and arrangements, to allow oxygen processing during the deposition process. The present method reduces or eliminates the requirement to develop and maintain such equipment or arrangements.

The embodiments of the present invention describe a method with respect to a semiconductor layer for a photovoltaic device. Though the discussion provides examples in the context of an absorber layer, the present method is equivalently applicable to other types of oxygen-containing layers used in the device.

In one embodiment, after the step of disposing the absorber layer, the absorber layer may be further treated with cadmium chloride ($CdCl_2$). In one embodiment, the absorber layer may be treated with a solution of $CdCl_2$. In another embodiment, the absorber layer may be treated with $CdCl_2$ vapor. The treatment with $CdCl_2$ is known to increase the carrier lifetime of the absorber layer. The treatment with cadmium chloride may be followed by an etching or rinsing step. In one embodiment, etching may be carried out using a suitable acid. Other etching techniques known in the art may also be employed.

A p+-type semiconducting layer may be further disposed on the absorber layer by depositing a p+-type material using any suitable technique, for example PECVD, in one embodiment. In an alternate embodiment, a p+-type semiconductor layer may be disposed on the absorber layer by chemically treating the absorber layer to increase the carrier density on a back-side (side in contact with the metal layer and opposite to the window layer) of the absorber layer. In one embodiment, the photovoltaic device may be completed by depositing a back contact layer, for example, a metal layer on the p+-type semiconductor layer.

EXAMPLES

The following examples are presented to further illustrate certain embodiments of the present invention. These examples should not be read to limit the invention in any way.

Inventive Example

Preparation of Cadmium Telluride Photovoltaic Device Having a CdTe Layer Deposited Using an Oxidized CdTe Source A cadmium telluride photovoltaic device was prepared by depositing a cadmium telluride (CdTe) layer over a cadmium sulfide (CdS) layer deposited on $SnO_2$:F (FTO) transparent conductive oxide (TCO) coated substrate. The substrate was 3 millimeter thick soda-lime glass, coated with a FTO transparent conductive layer (450 nm) and a thin high resistance transparent $ZnSnO_x$ (ZTO) layer (100 nm). Cadmium sulfide (CdS:O) layer was deposited on the ZTO layer in the presence of oxygen (CdS:O (5% O)) at a thickness of about 80 nm.

For the preparation of the oxidized CdTe source, CdTe powder was annealed at about 550 degrees Celsius in about 1 Torr oxygen pressure for about 15 minutes.

The oxidized CdTe source was employed for the deposition of the CdTe:O layer. The CdTe layer was deposited using a close spaced sublimation process at a substrate temperature of about 550 degrees Celsius and a source temperature of about 625 degrees Celsius. During ramping of the substrate and source temperatures, the substrate temperature ramp rate was greater than the source temperature ramp rate. The deposition began when the substrate temperature reached its setpoint and the source temperature exceeded the substrate temperature. This step was carried out for about 120 seconds resulting in the deposition of CdTe:O layer on the CdS:O layer.

The deposited CdTe:O layer was further treated with cadmium chloride at a temperature of about 400 degrees Celsius for about 20 minutes in air. At the end of the stipulated time, the CdTe:O layer was treated with a copper solution and subjected to annealing at a temperature of about 200 degrees Celsius for duration of about 18 minutes. Gold was then deposited on the copper treated layer as the back contact by evaporation process to complete the device fabrication process.

Comparative Example 1

Preparation of the Cadmium Telluride Photovoltaic Device Having a CdTe Layer Deposited with Continuous Oxygen Flow A photovoltaic device was prepared similar to the photovoltaic devices in inventive example except the CdTe layer was deposited with oxygen flowing continuously throughout the CdTe growth process. This step resulted in the deposition of CdTe:O layer on the CdS window layer

Comparative Example 2

Preparation of the Cadmium Telluride Photovoltaic Device Having a CdTe Layer Deposited in the Absence of Oxygen Flow A photovoltaic device was prepared similar to the photovoltaic device in inventive example except the CdTe layer was deposited without oxygen flowing through the growth process.

Table 1 shows the average (Avg) efficiency, open-circuit voltage ($V_{OC}$), short-circuit current density ($J_{SC}$), and fill factor (FF) values for Inventive example compared to Comparative examples 1 and 2 and standard deviation (StDev) associated with these values.

TABLE 1

Performance parameters for CdTe photovoltaic devices

| Sample | Efficiency (%) Avg | StDev | $V_{OC}$ (V) Avg | StDev | $J_{SC}$ (mA/cm$^2$) Avg | StDev | FF (%) Avg | StDev |
|---|---|---|---|---|---|---|---|---|
| Inventive example | 13.11 | 0.14 | 0.815 | 0.002 | 21.4 | 0.2 | 75 | 0 |
| Comparative Example 1 | 13.44 | 0.49 | 0.822 | 0.002 | 21.7 | 0.3 | 75 | 2 |
| Comparative Example 2 | 12.34 | 0.19 | 0.826 | 0.001 | 20.7 | 0.2 | 72 | 0 |

It may be noted from Table 1 that the devices with the CdTe:O layer deposited using oxidized CdTe source (Inventive example) displayed performance parameters values between the performance parameters of devices having CdTe layer deposited using continuous oxygen flow (Comparative example 1) and the performance parameters of devices having CdTe layer deposited in the absence of oxygen flow (Comparative example 2). The inventive example device showed improved performance as compared to the device of Comparative example 2 and approximately similar performance to the device of Comparative example 1.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for making a photovoltaic device, comprising:
    disposing a window layer over a substrate;
    disposing an absorber layer over the window layer;
    wherein disposing the window layer, disposing the absorber layer, or disposing the window layer and the absorber layer, comprises:
    oxidizing a source material precursor to form a source material; then
    introducing the source material into a deposition zone, and thereafter, depositing a film comprising a constituent of the source material and oxygen.

2. A method for making a photovoltaic device, comprising:
    disposing a window layer over a substrate;
    disposing an absorber layer over the window layer;
    wherein disposing the absorber layer, comprises:
    oxidizing a source material precursor that comprises cadmium and tellurium to form a source material comprising a mixture of cadmium, tellurium and oxygen as at least one of an alloy and a compound; then introducing the source material into a deposition zone; and thereafter, depositing a film comprising cadmium telluride and oxygen.

3. A method for making a photovoltaic device, comprising:
disposing a window layer over a substrate;
disposing an absorber layer over the window layer;
wherein disposing the window layer, disposing the absorber layer, or disposing the window layer and disposing the absorber layer, comprises:
introducing a source material into a deposition zone, wherein the source material comprises oxygen and a constituent element as a mixture of elements in at least one of an alloy and a compound of oxygen and the constituent element; the constituent element being a constituent of the window layer, of the absorber layer, or of the window layer and the absorber layer; and
depositing a film comprising the constituent element and oxygen.

4. The method of claim 3, wherein the window layer, the absorber layer, or the window layer and the absorber layer comprise a telluride, a selenide, a sulfide or a hydride.

5. The method of claim 4, wherein the window layer comprises a semiconductor material selected from the group consisting of cadmium sulfide, cadmium selenide, zinc telluride, zinc selenide, zinc sulfide, indium selenide, indium sulfide, and zinc hydride.

6. The method of claim 4, wherein the absorber layer comprises a semiconductor material selected from the group consisting of cadmium telluride, cadmium zinc telluride, cadmium sulfur telluride, cadmium manganese telluride, and cadmium magnesium telluride.

7. The method of the claim 3, wherein disposing the window layer comprises depositing via a vacuum deposition technique selected from the group consisting of evaporation deposition, electron beam physical vapor deposition, sputter deposition, cathode arc deposition, and pulsed laser deposition.

8. The method of claim 3, wherein disposing the absorber layer comprises depositing via a deposition technique selected from the group consisting of closed space sublimation, diffused transport deposition, and vapor transport deposition.

9. The method of claim 3, further comprising oxidizing a source material precursor to form the source material.

10. The method of claim 9, wherein the steps disposing a window layer over a substrate and disposing an absorber layer over the window layer are performed within a deposition chamber; and wherein the step of oxidizing a source material precursor is performed outside the deposition chamber.

11. The method of claim 9, wherein oxidizing the source material precursor comprises oxidizing at an oxygen pressure ranging from about 100 mTorr to about 10 Torr.

12. The method of claim 11, wherein oxidizing the source material precursor comprises oxidizing at an oxygen pressure ranging from about 400 mTorr to about 1 Torr.

13. The method of claim 9, wherein oxidizing the source material precursor comprises oxidizing at a temperature ranging from about 550 degrees Celsius to about 750 degrees Celsius.

14. The method of claim 3, wherein depositing the film comprises depositing the film to a thickness ranging from about 50 nanometers to about 4 micrometers.

15. The method of claim 3, wherein depositing the film comprises depositing the film with a concentration of oxygen that ranges from about $4 \times 10^{17}$ cm$^{-3}$ to $2 \times 10^{19}$ cm$^{-3}$ within the film.

16. The method of claim 15, wherein depositing the film comprises depositing the film having a uniform distribution of the concentration of oxygen throughout the film.

17. The method of claim 15, wherein depositing the film comprises depositing the film having a graded profile of the concentration of oxygen through a thickness of the film.

18. The method of claim 3, wherein the source material comprises an oxide of the constituent element.

19. The method of claim 3, further comprising a step of introducing an additional source material into the deposition zone prior to the step of depositing a film; wherein the additional source material comprises an additional constituent of the window layer, of the absorber layer, or of both layers, such that the step of depositing a film includes depositing a film comprising the constituent element, the additional constituent and oxygen.

20. The method of claim 3, further comprising a step of subjecting the film comprising the constituent element and oxygen to a process treatment.

21. The method of claim 20, wherein the process treatment is selected from one of: a sulfurization process, a treatment with cadmium chloride, an acid etching process, and combination of a treatment with cadmium chloride and an acid etching process.

* * * * *